United States Patent [19]
Henley et al.

[11] Patent Number: 6,048,411
[45] Date of Patent: Apr. 11, 2000

[54] SILICON-ON-SILICON HYBRID WAFER ASSEMBLY

[75] Inventors: Francois J. Henley, Los Gatos; Nathan W. Cheung, Albany, both of Calif.

[73] Assignee: Silicon Genesis Corporation, Campbell, Calif.

[21] Appl. No.: 09/025,966

[22] Filed: Feb. 19, 1998

Related U.S. Application Data

[60] Provisional application No. 60/046,276, May 12, 1997.

[51] Int. Cl.[7] .................................................. H01L 29/06
[52] U.S. Cl. ............................................................ 148/33.5
[58] Field of Search ............................. 117/915; 148/33, 148/33.2, 33.4, 33.5; 438/455, 458, 459, 514, 515, 526, 530, 977

[56] References Cited

U.S. PATENT DOCUMENTS

| | | | |
|---|---|---|---|
| 3,117,022 | 1/1964 | Bronson et al. | 117/212 |
| 3,225,820 | 12/1965 | Riordan | 165/26 |
| 3,551,213 | 12/1970 | Boyle | 148/1.5 |
| 3,786,359 | 1/1974 | King | 328/233 |
| 3,806,380 | 4/1974 | Kitada et al. | 148/159 |
| 3,832,219 | 8/1974 | Nelson et al. | 117/93.3 |
| 3,900,636 | 8/1975 | Curry et al. | 427/38 |
| 3,915,757 | 10/1975 | Engel | 148/6 |
| 3,957,107 | 5/1976 | Altoz et al. | 165/32 |
| 3,993,909 | 11/1976 | Drews et al. | 250/492 A |
| 4,006,340 | 2/1977 | Gorinas | 219/121 |
| 4,039,416 | 8/1977 | White | 204/192 |
| 4,074,139 | 2/1978 | Pankove | 250/492 A |
| 4,107,350 | 8/1978 | Berg et al. | 427/38 |
| 4,108,751 | 8/1978 | King | 204/192 N |
| 4,116,751 | 9/1978 | Zaromb . | |
| 4,121,334 | 10/1978 | Wallis | 29/589 |
| 4,170,662 | 10/1979 | Weiss et al. | 427/38 |
| 4,252,837 | 2/1981 | Auton | 427/39 |
| 4,274,004 | 6/1981 | Kanai | 250/442 |
| 4,342,631 | 8/1982 | White et al. | 204/192 |
| 4,346,123 | 8/1982 | Kaufmann | 427/38 |
| 4,361,600 | 11/1982 | Brown | 427/93 |
| 4,368,083 | 1/1983 | Bruel et al. | 148/1.5 |
| 4,412,868 | 11/1983 | Brown et al. | 148/1.5 |
| 4,452,644 | 6/1984 | Bruel et al. | 148/1.5 |
| 4,468,309 | 8/1984 | White | 204/192 |
| 4,471,003 | 9/1984 | Cann | 427/34 |
| 4,486,247 | 12/1984 | Ecer et al. | 148/31.5 |
| 4,490,190 | 12/1984 | Speri | 148/16.6 |
| 4,500,563 | 2/1985 | Ellenberger et al. | 427/38 |
| 4,508,056 | 4/1985 | Bruel et al. | 118/730 |
| 4,536,657 | 8/1985 | Bruel | 250/492.2 |
| 4,566,403 | 1/1986 | Fournier | 118/718 |
| 4,567,505 | 1/1986 | Pease | 357/81 |
| 4,568,563 | 2/1986 | Jackson et al. | 427/40 |
| 4,585,945 | 4/1986 | Bruel et al. | 250/492.2 |
| 4,684,535 | 8/1987 | Heinecke et al. | 427/38 |
| 4,704,302 | 11/1987 | Bruel et al. | 427/38 |
| 4,717,683 | 1/1988 | Parrillo et al. | 437/34 |
| 4,764,394 | 8/1988 | Conrad | 427/38 |
| 4,837,172 | 6/1989 | Mizuno et al. | 437/11 |
| 4,846,928 | 7/1989 | Dolins et al. | 156/626 |
| 4,847,792 | 7/1989 | Barna et al. | 364/552 |
| 4,853,250 | 8/1989 | Boulos et al. | 427/34 |

(List continued on next page.)

FOREIGN PATENT DOCUMENTS

| | | | |
|---|---|---|---|
| 0084287 | 7/1983 | European Pat. Off. | G05D 23/01 |
| 0099778 | 2/1984 | European Pat. Off. | H01J 37/20 |
| 0155875 | 2/1984 | European Pat. Off. | H01J 37/317 |
| 0112238 | 6/1984 | European Pat. Off. | H01J 37/317 |
| 0164281 | 12/1985 | European Pat. Off. | H01L 21/76 |
| 0112230 | 4/1987 | European Pat. Off. | H01J 37/317 |
| 0181249 | 6/1989 | European Pat. Off. | D21C 9/00 |
| 0504714 | 9/1992 | European Pat. Off. | H01L 21/76 |
| 0533551 | 3/1993 | European Pat. Off. | H01L 21/265 |
| 0355913 | 12/1993 | European Pat. Off. | H01L 21/316 |
| 0665588 | 2/1995 | European Pat. Off. | H01L 21/76 |
| 0660140 | 6/1995 | European Pat. Off. | G02B 5/18 |
| 0665587 | 8/1995 | European Pat. Off. | H01L 21/68 |
| 0379828 | 9/1995 | European Pat. Off. | H01J 37/32 |
| 0459177 | 12/1995 | European Pat. Off. | H01J 37/32 |
| 0703609 | 3/1996 | European Pat. Off. | H01L 21/762 |
| 0763849 | 3/1997 | European Pat. Off. | H01L 21/20 |
| 1558881 | 1/1969 | France . | |
| 2261802 | 2/1974 | France | B01D 59/00 |
| 2235474 | 4/1974 | France | H01J 27/00 |
| 2298880 | 1/1975 | France . | |
| 2266304 | 4/1975 | France | H01L 21/463 |
| 2519437 | 1/1982 | France | G05D 23/01 |
| 2529383 | 6/1982 | France | H01J 37/20 |

(List continued on next page.)

OTHER PUBLICATIONS

B.H.Lee et al., "A Novel Pattern Transfer Process for Bonded SOI Giga–bit DRAMSs," 1996 IEEE Int'l, SOI Conference Proceedings, IEEE Electron Devices Society, pp. 1996.

Chu, Paul K. et al., "Recent Applications of Plasma Immersion Ion Implantation," Semiconductor International, pp. 165–172, 1996.

(List continued on next page.)

*Primary Examiner*—Charles Bowers
*Assistant Examiner*—Keith Christianson
*Attorney, Agent, or Firm*—Townsend and Townsend and Crew LLP

[57] ABSTRACT

A hybrid silicon-on-silicon substrate. A thin film (2101) of single-crystal silicon is bonded to a target wafer (46). A high-quality bond is formed between the thin film and the target wafer during a high-temperature annealing process. It is believed that the high-temperature annealing process forms covalent bonds between the layers at the interface (2305). The resulting hybrid wafer is suitable for use in integrated circuit manufacturing processes, similar to wafers with an epitaxial layer.

11 Claims, 4 Drawing Sheets

U.S. PATENT DOCUMENTS

| | | |
|---|---|---|
| 4,883,561 | 11/1989 | Gmitter et al. . |
| 4,887,005 | 12/1989 | Rough et al. ............... 315/111.21 |
| 4,894,709 | 1/1990 | Phillips et al. ..................... 357/82 |
| 4,931,405 | 6/1990 | Kamijo et al. ..................... 437/12 |
| 4,948,458 | 8/1990 | Ogle ................................. 156/643 |
| 4,952,273 | 8/1990 | Popov ............................... 156/643 |
| 4,960,073 | 10/1990 | Suzuki et al. .................... 118/723 |
| 4,982,090 | 1/1991 | Wittmaack . |
| 4,996,077 | 2/1991 | Moslehi et al. ..................... 427/38 |
| 5,015,353 | 5/1991 | Hubler et al. ................ 204/192.31 |
| 5,034,343 | 7/1991 | Rouse et al. ........................ 437/86 |
| 5,070,040 | 12/1991 | Pankove ............................. 437/209 |
| 5,082,793 | 1/1992 | Li ......................................... 437/26 |
| 5,110,748 | 5/1992 | Sarma ................................. 437/51 |
| 5,133,826 | 7/1992 | Dandl ................................ 156/345 |
| 5,196,355 | 3/1993 | Wittkower ......................... 437/24 |
| 5,198,371 | 3/1993 | Li ........................................ 437/24 |
| 5,202,095 | 4/1993 | Houchin et al. ................. 422/186 |
| 5,203,960 | 4/1993 | Dandl ................................ 156/643 |
| 5,234,529 | 8/1993 | Johnson ............................ 156/345 |
| 5,234,535 | 8/1993 | Beyer et al. . |
| 5,242,861 | 9/1993 | Inaba . |
| 5,250,328 | 10/1993 | Otto ................................... 427/535 |
| 5,252,178 | 10/1993 | Moslehi ............................. 156/643 |
| 5,269,880 | 12/1993 | Jolly et al. . |
| 5,273,610 | 12/1993 | Thomas, III et al. ............ 156/345 |
| 5,304,509 | 4/1994 | Sopori ............................... 437/173 |
| 5,342,472 | 8/1994 | Imahashi et al. ................. 156/345 |
| 5,354,381 | 10/1994 | Sheng . |
| 5,368,710 | 11/1994 | Chen et al. ................... 204/192.32 |
| 5,370,765 | 12/1994 | Dandl ................................ 156/643 |
| 5,374,564 | 12/1994 | Bruel . |
| 5,376,560 | 12/1994 | Aronowitz et al. ................ 437/24 |
| 5,404,079 | 4/1995 | Ohkuni et al. ............... 315/111.81 |
| 5,405,480 | 4/1995 | Benzing et al. .................. 156/345 |
| 5,411,592 | 5/1995 | Ovshinsky et al. .............. 118/718 |
| 5,435,880 | 7/1995 | Minato et al. .................... 156/345 |
| 5,476,691 | 12/1995 | Komvopoulos et al. . |
| 5,487,785 | 1/1996 | Horiike et al. ................... 118/723 |
| 5,494,835 | 2/1996 | Bruel ................................. 437/24 |
| 5,504,328 | 4/1996 | Bonser .............................. 250/288 |
| 5,539,245 | 7/1996 | Imura et al. . |
| 5,558,718 | 9/1996 | Leung . |
| 5,559,043 | 9/1996 | Bruel ................................... 437/24 |
| 5,653,811 | 8/1997 | Chan ................................. 118/723 |
| 5,710,057 | 1/1998 | Kenney . |

FOREIGN PATENT DOCUMENTS

| | | | |
|---|---|---|---|
| 2537768 | 8/1982 | France .............. G21K 1/00 |
| 2537777 | 12/1982 | France .......... H01L 21/265 |
| 2560426 | 2/1984 | France .............. G21K 5/00 |
| 2563377 | 4/1984 | France ........... H01L 21/223 |
| 2575601 | 12/1984 | France ............. H01L 21/66 |
| 2681472 | 9/1991 | France .......... H01L 21/265 |
| 2714524 | 12/1993 | France .......... H01L 21/265 |
| 2715501 | 1/1994 | France ............. H01L 21/20 |
| 2715502 | 1/1994 | France ........... H01L 21/302 |
| 2715503 | 1/1994 | France ........... H01L 23/13 |
| 2720189 | 5/1994 | France ........... H01L 21/322 |
| 2725074 | 9/1994 | France ............. H01L 21/20 |
| 60-235434 | 11/1958 | Japan ............. H01L 21/76 |
| 53-104156 | 9/1978 | Japan ........... H01L 21/322 |
| 58-144475 | 8/1983 | Japan .............. C23C 15/00 |
| 60-83591 | 10/1983 | Japan ................. C12P 7/18 |
| 59-19394 | 1/1984 | Japan . |
| 59-46750 | 3/1984 | Japan ............. H01J 37/317 |
| 59-54217A | 3/1984 | Japan ............. H01L 21/20 |
| 59-114744 | 7/1984 | Japan ............. H01J 37/317 |
| 59-139539 | 8/1984 | Japan ............... H01J 37/30 |
| 60-207237 | 10/1985 | Japan ............... H01J 37/05 |
| 4-76503 | 7/1990 | Japan ................ G02B 6/00 |
| 4-246594 | 9/1992 | Japan ................ B41N 1/12 |
| 5-211128 | 8/1993 | Japan ........... H01L 21/205 |
| 7-215800 | 8/1995 | Japan ............. C30B 33/00 |
| 7-254690 | 10/1995 | Japan ............. H01L 27/12 |
| 7-263291 | 10/1995 | Japan ............. H01L 21/02 |
| 8-97389 | 4/1996 | Japan ............. H01L 27/12 |
| 2221991 | 7/1989 | United Kingdom ........... H01L 21/76 |
| WO 95/10718 | 4/1995 | WIPO ............. F16H 48/20 |
| WO 95/20824 | 8/1995 | WIPO ............. H01L 21/58 |
| WO 95/31825 | 11/1995 | WIPO ............. H01L 21/76 |

OTHER PUBLICATIONS

Alles, Michael et al., "Thin Film Silicon on Insulator: An Enabling Technology," Semiconductor International, pp. 67–72, 1997.

Chu, Paul K., "Synthesis of SOI Materials Using Plasma Immersion Ion Implantation," Mat. Res. Soc. Symp. Proc. vol. 438 ©1997 Materials Research Society, pp. 333–343, 1997.

Picraux, S. Thomas et al., "Ion Implantation of Surfaces," Scientific American, vol. 252, No. 3., pp. 102–113, 1985.

U.S. Dept. of Energy, "The Fusion Connection: . . . ", Plasma Coating, pp. 6–7, 1985.

Cassidy, Victor M., "Ion Implantation Process Toughens Metalworking Tools," Modern Metals, pp. 65–67, 1984.

Sioshansi, Piran, "Ion Beam Modification of Materials for Industry," Thin Solid Film, vol. 118, pp. 61–71, 1984.

Hulett, D.M. et al., "Ion Nitriding and Ion Implantation: A Comparison," Metal Progress, pp. 18–21, 1985.

Renier, M. et al., "A New Low–Engergy Ion Implanter for Bombardment of Cylindrical Surfaces," Vacuum, vol. 35, No. 12, pp. 577–578, 1985.

Basta, Nicholas, "Ion–Beam Implantation," High Technology, 1985.

Patent Abstracts of Japan, vol. 7, No. 107 (E–174), May 11, 1993, JP–58–030145 A, Feb. 22, 1983.

Matsuda et al., "Large Diameter Ion Beam Implantation System," Nuclear Intruments and Methods, vol. B21, pp. 314–316, 1987.

Stanley Wolf Ph.D., Silicon Processing for the VLSI Era (vol. 2), pp. 66–79.

Cheung, N.W., "Plasma Immersion Ion Implantation for Semiconductor Processing," Material Chemistry and Physics, vol. 46/2–3, pp. 132–139 (1996).

X. Lu et al., "SOI Material Technology Using Plasma Immersion Ion Implantation," Proceedings 1996 IEEE International SOI Conference (Oct. 1996).

Veldkamp, W.B. et al., "Binary Optics," Scientific American, pp. 50–55, May 1992.

I.B.M. Technical Disclosure Bulletinm, vol. 29, No. 3, p. 1416, Aug. 1986.

Li, J., "Novel Semiconductor Substrate Formed by Hydrogen Ion Implantation into Silicon," Appl. Phys. Lett., vol. 55, No. 21, pp. 2223–2224, Nov. 20, 1989.

Burggraff, Peter, "Advanced Plasma Source: What's Working?" Semiconductor International, pp. 56–59, May 1994.

Chu, P.K. et al., Plasma Immersion Ion Implantation—A Fledgling Technique for Semiconductor Processing, Materials Science and Engineering Reports: A Review Journal, pp. 207–280, vol. R17, Nos. 6–7, Nov. 30, 1996.

Moreau, Wayne M., "Semiconductor Lithography, Principles, Practices, and Materials," Plenum Press, 1988.

Wolf, S., Silicon Processing for the VLSI Era (vol. 2), Lattice Press, 1990.

Carter, G. et al., "The Collection of Ions Implanted in Semiconductors", *Radiation Effects*, Sep. 1972. vol. 16, No. 1–2, pp. 107–114. Abstract Only.

SILICON-ON-SILICON HYBRID WAFER ASSEMBLY

CROSS REFERENCE TO RELATED APPLICATIONS

This application claims priority from the provisional patent application entitled A CONTROLLED CLEAVAGE PROCESS AND RESULTING DEVICE, filed May 12, 1997 and assigned Application Ser. No. 60/046,276, the disclosure of which is hereby incorporated in its entirety for all purposes. This application is being filed on the same date as related Application Ser. No. 09/028,870 entitled "A SILICON-ON-SILICON WAFER BONDING PROCESS USING A UNIFORM THIN FILM" (Attorney Docket No. 018419-000110) and Application Ser. No. 09/025,967 entitled "A SILICON-ON-SILICON WAFER BONDING PROCESS USING A THIN FILM BLISTER SEPARATION METHOD" (Attorney Docket No. 018419-000112).

BACKGROUND OF THE INVENTION

The present invention relates to the manufacture of substrates. More particularly, the invention provides a technique for manufacturing a silicon-on-silicon substrate assembly. The assembly includes two substrates that are bonded together for use in the fabrication of a substrate for semiconductor integrated circuits, for example. But it will be recognized that the invention has a wider range of applicability; it can also be applied to other substrates for multi-layered integrated circuit devices, three-dimensional packaging of integrated semiconductor devices, microelectromechanical systems ("MEMS"), sensors, actuators, solar cells, biological and biomedical devices, and the like.

Wafers for electronic device fabrication are often cut from an ingot, or boule, of material with an abrasive saw. The wafer often serves as both a mechanical substrate and a semiconductor material to form electronic devices in or on. One of the most common examples of this is cutting silicon wafers from a silicon ingot. The wafers are typically polished to a very fine surface finish after "lapping" the wafer to remove the mechanical damage left by the abrasive saw, and after "backlapping" the other side of the wafer to remove saw damage and to produce a wafer of the desired thickness. In some processes, devices are fabricated directly in or on the silicon wafer. In other processes, a layer of semiconductor material is grown, for example by epitaxy, on the wafer. The epitaxial layer may provide lower impurity concentrations, or be of a different semiconductor type than the wafer. The devices are formed in what is known as the "active" layer, which is typically only a micron or so thick.

Epitaxial layers have been used successfully on smaller wafers and for smaller devices. Unfortunately, epitaxial layers have some associated problems that critically affect wafer yield and device yield as the size of either the wafer or the device increases. Epitaxial layers that are grown on a substrate typically adopt the crystalline structure of the substrate. In most cases, the substrate is a single crystal of a particular orientation. The most favored crystallographic orientation for growing an epitaxial layer, however, may not be the most favored crystallographic orientation for forming semiconductor devices. Additionally, surface defects or contamination on the surface of the substrate can lead to "pipes", "spikes", and other types of defects in the epitaxial layer. Often, a single defect will ruin a particular circuit, or cell, on a substrate. As the size of the cells gets bigger and more complex, the chance that any particular cell will fail because of a defect in the epitaxy layer increases. The size of the cells generally increases, given a particular processing technology, as the device count increases, which usually indicates an increase in circuit complexity and functionality.

The size of silicon wafers also continues to increase. Many state-of-the-art semiconductor devices are fabricated on 8-inch silicon wafers. Twelve-inch wafers are available. The semiconductor fabrication industry is moving toward using wafers of this size, but, as with most changes in technology, must solve some problems first. One of the problems is that growing a high-quality epitaxial layer on a 12-inch wafer is very difficult. Some conventional processes do not have a sufficient yield of good wafers through the epitaxial growth process to make using a 12-inch wafer economically attractive. This problem is compounded by the cost of a 12-inch substrate, which can be quite high.

From the above, it is seen that a technique for providing a substitute for an epitaxial layer that is cost effective and efficient is desirable.

SUMMARY OF THE INVENTION

According to the present invention, a technique for applying a thin film of silicon material to a target, or handle, wafer is provided. This technique separates thin films of material from a donor substrate by implanting particles, such as hydrogen ions, into the donor substrate, and then separating a thin film of material above the layer of implanted particles. The thin film can be bonded to a target wafer that provides mechanical support to form a hybrid substrate before or after separation.

In a specific embodiment, the present invention provides a process for forming a film of material from a donor substrate, typically a single crystal of silicon, using a controlled cleaving process. That process includes a step of introducing energetic particles (e.g., charged or neutral molecules, atoms, or electrons having sufficient kinetic energy) through a surface of a donor substrate to a selected depth underneath the surface, where the particles are at a relatively high concentration to define a thickness of donor substrate material (e.g., thin film of detachable material) above the selected depth.

The surface of the donor wafer is then typically attached to a target wafer, that will provide mechanical support for the thin film using a low-temperature bonding process. The target wafer can be a single crystal, polycrystalline, or amorphous, depending on the desired hybrid wafer characteristics. Energy is applied to a selected region of the donor substrate material to initiate a controlled cleaving action in the donor substrate, whereupon the cleaving action is made using a propagating cleave front(s) to free the donor material from a remaining portion of the donor substrate. The thin film is then permanently bonded to the target wafer, typically with a high-temperature annealing process.

In another embodiment, a layer of microbubbles is formed at a selected depth in the substrate. The substrate is globally heated and pressure in the bubbles eventually shatters the substrate material generally in the plane of the microbubbles, separating a thin film of silicon from the substrate.

The present invention achieves these benefits and others in the context of known process technology. However, a further understanding of the nature and advantages of the present invention may be realized by reference to the latter portions of the specification and attached drawings.

DESCRIPTION OF SPECIFIC EMBODIMENTS

The present invention provides a technique for removing a high-quality thin film of material from one substrate, and permanently bonding it to another substrate. The thin film of material forms a hybrid substrate with the second substrate and can substitute for an epitaxial layer on a conventional wafer. The invention will be better understood by reference to the Figs. and the descriptions below. The description begins with explanations of thin film removal processes before discussing the wafer bonding processes and resultant structures.

1. Controlled Cleaving Techniques

In a controlled cleaving process, a cleave is initiated by subjecting the material with sufficient energy to fracture the material in one region, causing a cleave front, without uncontrolled shattering or cracking. The cleave front formation energy ($E_c$) must often be made lower than the bulk material fracture energy ($E_{mat}$) at each region to avoid shattering or cracking the material. The directional energy impulse vector in diamond cutting or the scribe line in glass cutting are, for example, the means in which the cleave energy is reduced to allow the controlled creation and propagation of a cleave front. The cleave front is in itself a higher stress region and once created, its propagation requires a lower energy to further cleave the material from this initial region of fracture. The energy required to propagate the cleave front is called the cleave front propagation energy ($E_p$). The relationship can be expressed as:

$$E_c = E_p + [\text{cleave front stress energy}]$$

A controlled cleaving process is realized by reducing $E_p$ along a favored direction(s) above all others and limiting the available energy to be below the $E_p$ of other undesired directions. In any cleave process, a better cleave surface finish occurs when the cleave process occurs through only one expanding cleave front, although multiple cleave fronts do work.

This technique uses a relatively low temperature during the controlled cleaving process of the thin film to reduce temperature excursions of the separated film, donor substrate, or multi-material films according to other embodiments. This lower temperature approach allows for more material and process latitude such as, for example, cleaving and bonding of materials having substantially different thermal expansion coefficients. The energy or stress in the substrate is limited to a value below a cleave initiation energy, which generally removes a possibility of creating random cleave initiation sites or fronts. This reduces cleave damage (e.g., pits, crystalline defects, breakage, cracks, steps, voids, excessive roughness) often caused in pre-existing techniques. Moreover, a controlled-cleavage method reduces damage caused by higher than necessary stress or pressure effects and nucleation sites caused by the energetic particles as compared to other techniques.

Figure 1:
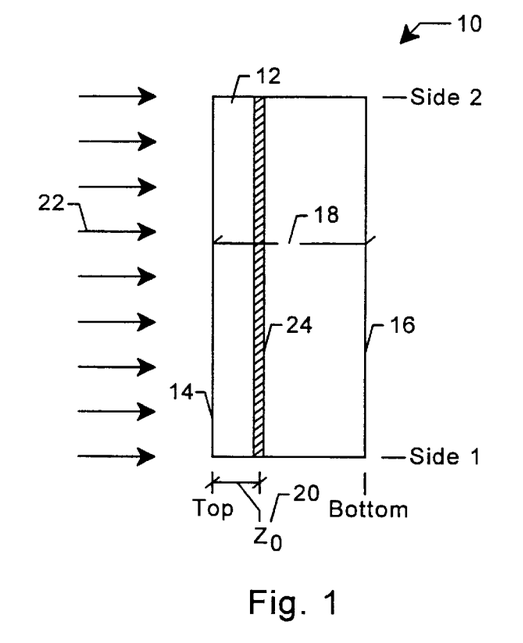
FIGS. 1–3 are simplified diagrams illustrating a controlled cleaving technique according to an embodiment of the present invention.

FIG. 1 is a simplified cross-sectional view diagram of a substrate 10 according to the present invention. As merely an example, substrate 10 is a single-crystal silicon wafer which includes a material region 12 to be removed, which is a thin relatively uniform film derived from the substrate material. The silicon wafer 10 includes a top surface 14, a bottom surface 16, and a thickness 18. Substrate 10 also has a first side (side 1) and a second side (side 2) (which are also referenced below in the Figs.). Material region 12 also includes a thickness 20, within the thickness 18 of the silicon wafer.

Hydrogen ions are implanted 22 through the top surface 14 of the silicon wafer to a selected depth 24, which defines the thickness 20 of the material region 12, termed the thin film of material. The ions can be implanted by a variety of techniques, including beam line ion implantation, plasma immersion ion implantation ("PIII"), or ion shower. Beam line ion implantation can be performed with equipment manufactured from companies such as Applied Materials, Eaton Corporation, Varian, and others. Examples of plasma immersion implantation techniques are described in "Recent Applications of Plasma Immersion Ion Implantation," Paul K. Chu, Chung Chan, and Nathan W. Cheung, SEMICONDUCTOR INTERNATIONAL, pp. 165–172, Jun. 1996, and "Plasma Immersion Ion Implantation—A Fledgling Technique for Semiconductor Processing,", P. K. Chu, S. Qin, C. Chan, N. W. Cheung, and L. A. Larson, MATERIALS SCIENCE AND ENGINEERING REPORTS: A REVIEW JOURNAL, pp. 207–280, Volume R17, Nos. 6–7, (Nov. 30, 1996), which are both hereby incorporated by reference for all purposes.

Hydrogen ions are desirable because they easily travel through the substrate material to the selected depth without substantially damaging the material region that the particles traverse through. The particles can also be derived from compounds such as gases, e.g., hydrogen gas, water vapor, methane, and hydrogen compounds, and other light atomic mass particles. Alternatively, other ions or combinations of ions may be used, depending on the material of the donor substrate, the thickness of the film to be removed, and the acceptable level of damage remaining in the thin film after processing.

Implantation dose ranges from about $10^{15}$ to about $10^{18}$ atoms/cm$^2$, and preferably the dose is greater than about $10^{16}$ atoms/cm$^2$. Implantation energy ranges from about 1 KeV to about 1 MeV, and is generally about 50 KeV. Implantation temperature ranges from about –200 to about 600° C., and is preferably less than about 400° C. to minimize escape of the implanted particles (e.g. via the diffusion mechanism). The hydrogen ions can be selectively introduced into the silicon wafer to the selected depth at an accuracy of about +/–0.03 to +/–0.05 microns.

Effectively, the implanted particles add stress or reduce fracture energy along a plane parallel to the top surface of the substrate at the selected depth. The energies depend, in part, upon the implantation species and conditions. These particles reduce a fracture energy level of the substrate at the selected depth. This allows for a controlled cleave along the implanted plane at the selected depth.

Figure 2:
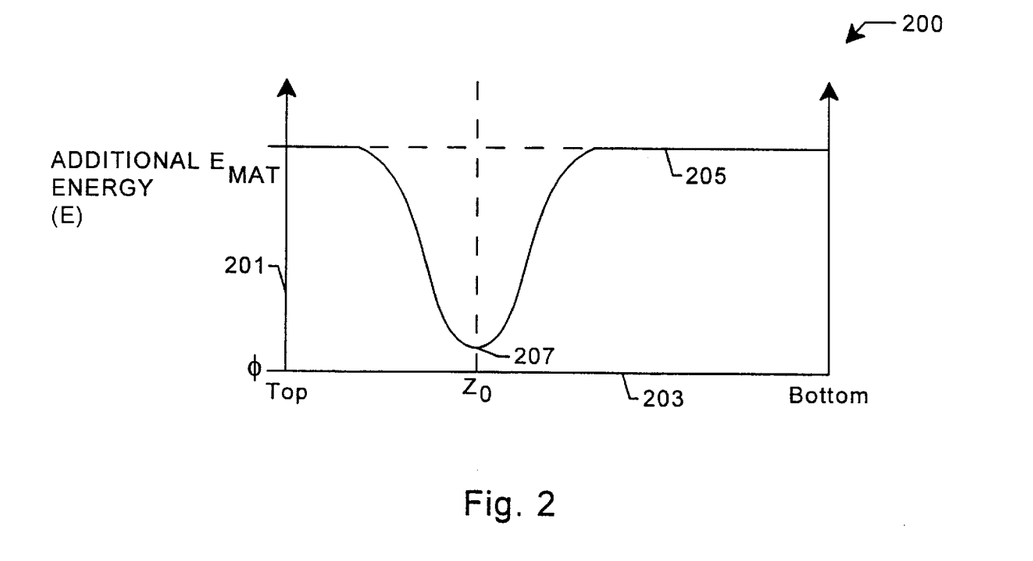

FIG. 2 is a simplified energy diagram 200 along a cross-section of the implanted substrate 10 according to the present invention. The diagram is merely an illustration and should not limit the scope of the claims herein. The simplified diagram includes a vertical axis 201 that represents an energy level (E) (or additional energy) to cause a cleave in the substrate. A horizontal axis 203 represents a depth or distance from the bottom of the wafer to the top of the wafer. After implanting particles into the wafer, the substrate has an average cleave energy represented as E 205, which is the amount of energy needed to cleave the wafer along various cross-sectional regions along the wafer depth. The cleave energy ($E_t$) is equal to the bulk material fracture energy ($E_{mat}$) in non-implanted regions. At the selected depth 20, energy ($E_{cz}$) 207 is lower since the implanted particles essentially break or weaken bonds in the crystalline structure (or increase stress caused by a presence of particles also contributing to lower energy ($E_{cz}$) 207 of the substrate) to lower the amount of energy needed to cleave the substrate at the selected depth. This takes advantage of the lower energy (i.e. increased stress) at the selected depth to cleave the thin film in a controlled manner. If necessary, the cleave energy can further be reduced by subjecting the wafer to an intermediate thermal step below 500° C.

Figure 3:
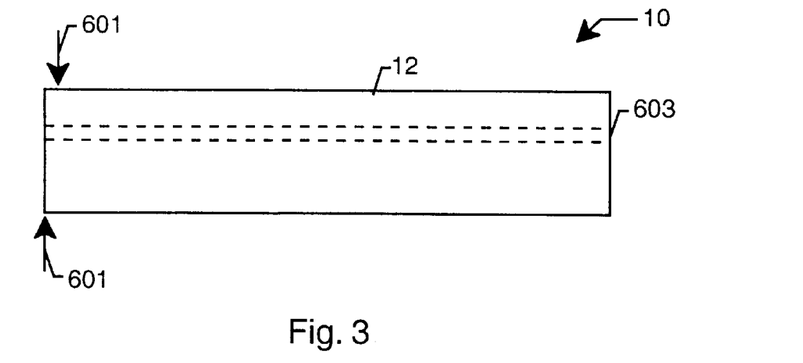

FIG. 3 is a simplified cross-sectional view of an implanted substrate 10 using selective positioning of cleave energy according to the present invention. This diagram is merely an illustration, and should not limit the scope of the claims herein. The implanted wafer undergoes a step of selective energy placement or positioning or targeting which provides a controlled cleaving action of the material region 12 at the selected depth. In this instance, the impulse is localized heating provided by a laser, although other heat sources, such as a heat lamp, or cold sources can be utilized. In another embodiment, a mechanical impulse is provided by twisting the target substrate with respect to the donor substrate, which generates maximum stress at the perimeter of the assembly, and minimum stress at the center. Of course, the type of source used depends upon the application.

Before locally heating the assembly, the stress in the implanted region was increased toward the energy level necessary to initiate the cleaving action without initiating the cleaving action. The global energy state of the substrate was raised by heating one side of the substrate to an intermediate temperature of about 350° C. with a heat lamp, or the substrate can be cooled, or differentially heated or cooled, that is a thermal gradient may be established across the assembly.

The removed material region provides a thin film of silicon material for processing. The silicon material possesses limited surface roughness and desired planarity characteristics for use in a silicon-on-silicon substrate. In certain embodiments, the surface roughness of the detached film has features that are less than about 60 nm, or less than about 40 nm, or less than about 20 nm. Accordingly, the present invention provides thin silicon films which can be smoother and more uniform than other techniques.

2. Another Cleaving Technique

Figure 4:
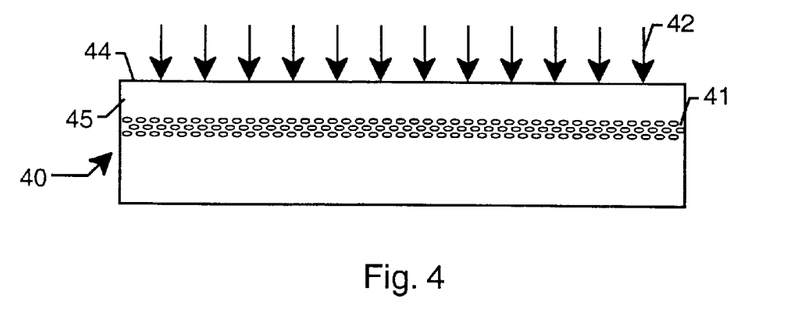
FIGS. 4–6 are simplified diagrams illustrating a blister-separation technique according to another embodiment of the present invention.
Figure 5:
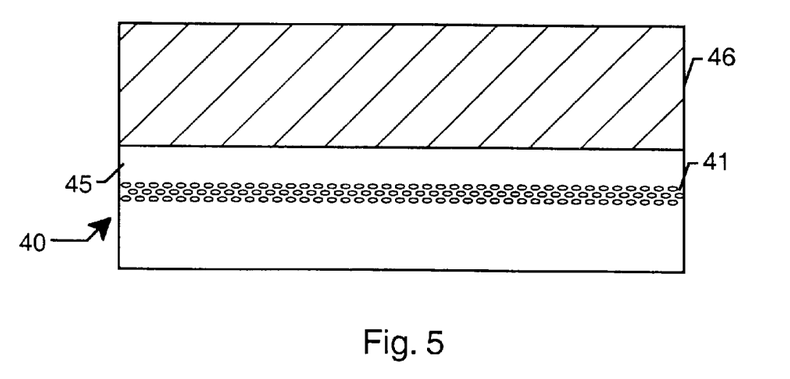
Figure 6:
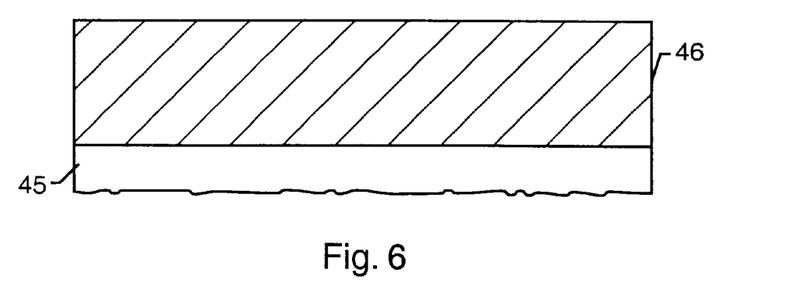

FIGS. 4–6 are simplified cross sections of a thin film of material being separated from a wafer according to a blister-separation method, such as a process known as "Smart Cut." An example of an implantation blister-separation method is described in U.S. Pat. No. 5,374,564, entitled *Process For The Production Of Thin Semiconductor Material Films*, by Michel Bruel, issued Dec. 20, 1994.

FIG. 4 shows a monocrystalline donor wafer 40 with a blister layer 41. The blister layer was formed by implanting hydrogen into the donor wafer, which is oriented such that a crystalline plane, or cleavage plane, is approximately parallel to the blister layer. For example, a dose of about $10^{16}$ cm$^{-2}$ hydrogen ions implanted into a {100} silicon wafer at 150 KeV formed a blister layer approximately 1.2 $\mu$m below the top surface 42 of the donor wafer 40. It is believed that the implanted hydrogen ions capture electrons to form hydrogen atoms, which in turn form diatomic hydrogen gas. The hydrogen gas starts to form a layer of microbubbles in the blister layer, which is parallel to a cleaving plane of the donor wafer. When the wafer is heated, gas pressure builds within the blister layer, and a thin layer 45 of the donor wafer will split off along the cleavage plane.

While gases other than hydrogen may be used, such as helium, neon, krypton, and xenon, hydrogen is advantageous. The braking process of hydrogen ions in silicon is predominantly an electronic, rather than nuclear, phenomena. This allows for a relatively high dosage to be implanted with relatively little damage to the silicon lattice, as compared to implanting similar doses of heavier ions. The electronic braking also provides a smaller range of distribution of implanted ions than would typically be obtained when implanting a heavier ion. This makes it possible to obtain suitable blister formation at a moderate implanted dose, and to separate a layer of silicon with a relatively smooth surface.

The thickness of the thin layer may be determined by appropriately choosing the implant energy. The expected thickness in {100} silicon has been calculated using the public-domain "TRIM" modeling software developed by J. Zeigler, as shown in Table 1.

TABLE 1

| ENERGY (KeV) | 10 | 50 | 100 | 150 | 200 | 500 | 1000 |
|---|---|---|---|---|---|---|---|
| Film Thickness ($\mu$m) | 0.14 | 0.5 | 0.88 | 1.27 | 1.72 | 5.59 | 15.67 |

FIG. 5 shows a target wafer 46 bonded to the donor wafer 40. The target wafer provides support to the thin film 45 of silicon that will be blistered off of the donor wafer. The target wafer is a silicon wafer. The donor wafer may be bonded to the target wafer by a variety of methods, as described above. As above, it is desirable that the bonding method used not induce separation of the thin film unless that separation is intended. After bonding, heat treating the wafer assembly causes pressure to build up in the hydrogen gas bubbles that have formed in the donor substrate, to separate the top layer of silicon (about 1–15 microns thick) from the donor wafer. The bonding, heat treating, and annealing can be performed in a continuous thermal process, if desired.

FIG. 6 shows the thin film 45 of silicon attached to the target wafer 46 after separating the thin film from the donor wafer.

3. Silicon-On-Silicon Process

A process for fabricating a silicon-on-silicon substrate according to the present invention may be briefly outlined as follows:

(1) Provide a donor silicon wafer with a highly polished surface;

(2) Introduce particles into the silicon wafer through the highly polished surface to a selected depth to define a thickness of silicon film;

(3) Provide a target substrate material with a highly polished surface;

(4) Prepare the surface of the donor wafer and/or the surface of the target wafer for beta bonding the donor wafer to the target wafer (optional);

(5) Beta bond the donor silicon wafer to the target substrate material by joining the two highly polished surfaces;

(6) Separate a thin film of material from the donor substrate, the thin film of material adhering to the target substrate;

(7) Anneal the hybrid substrate of the thin film and the target substrate to complete bonding of the two layers together;

(8) Polish a surface of the thickness of silicon film (optional).

This sequence of steps is merely an example and should not limit the scope of the claims defined herein. Further details with regard to the above sequence of steps are described in below in references to the Figs.

Figure 7:
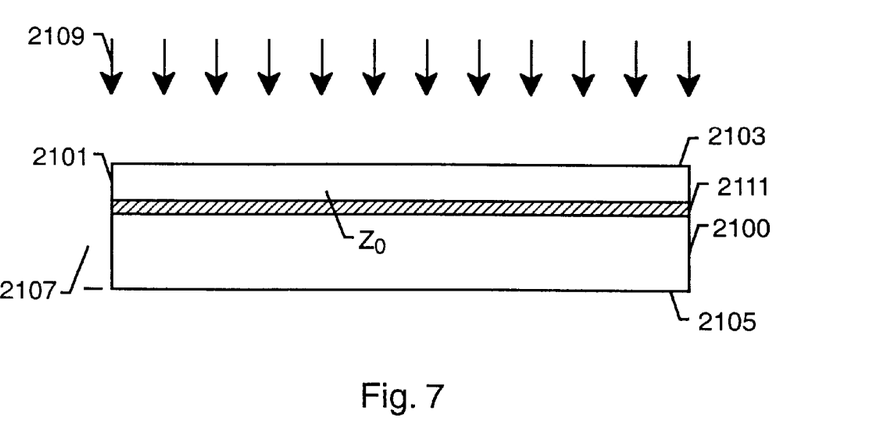
FIGS. 7–11 are simplified diagrams illustrating a method of forming a silicon-on-insulator substrate according to the present invention.

FIGS. 7–11 are simplified cross-sectional view diagrams of substrates undergoing a fabrication process for a silicon-on-silicon wafer according to the present invention. The process begins by providing a semiconductor substrate similar to the silicon wafer 2100, as shown by FIG. 7. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($z_0$), within the thickness 2107 of the silicon wafer above a layer 2111 of hydrogen ions or microbubbles, depending on the process used.

Hydrogen ions 2109 are implanted through the polished top surface of the silicon wafer to a selected depth, which defines the thickness of the material region, termed the thin film of material. As shown, the hydrogen ions (or microbubbles, depending on the process) have a desired concentration 2111 at the selected depth ($z_0$). A variety of techniques can be used to implant the ions into the silicon wafer. These techniques include ion implantation using, for example, beam line ion implantation equipment manufactured from companies such as Applied Materials, Eaton Corporation, Varian, and others. Alternatively, implantation occurs using a plasma immersion ion implantation ("PIII") technique. Of course, techniques used depend upon the application.

Figure 8:
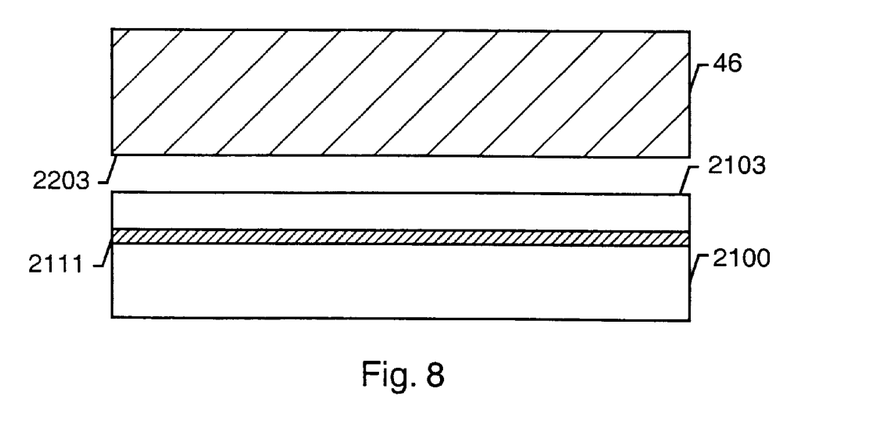

The process uses a step of preparing the implanted donor silicon wafer to bond to a workpiece, or target, silicon wafer, as illustrated in FIG. 8. The silicon wafers are first "beta bonded" using a low temperature thermal step. Beta bonding is a relatively weak bonding process that joins the donor substrate to the target substrate. It is believed that beta bonding arises from electrostatic, or van der Waals, forces. Beta bonding produces a joint between the donor substrate and the target substrate for the target substrate to act as a mechanical support for the thin film when it is subsequently separated from the donor wafer. Beta bonding is generally not robust enough to join the thin film to the target wafer during subsequent wafer processing, such as lapping, polishing, or dicing operations, but is sufficient to hold the thin film to the target wafer until the assembly can be annealed and securely bonded.

Prior to beta bonding, the surfaces of the wafers are stripped of native or residual oxide and thoroughly cleaned, such as with an RCA-I and RCA-II cleaning sequence. An example of a solution used to clean the wafer is a mixture of $H_2O_2$—$H_2SO_4$. A dryer dries the wafer surfaces to remove any residual liquids or particles from the wafer surfaces. In an alternative process, the clean silicon surfaces of the wafers are dipped in hydrofluoric acid.

The cleaned and/or activated surfaces are then pressed together under moderate pressure. Using a low temperature beta bonding process generally ensures that the implanted particles do not initiate a fracture, or not diffuse or outgas. In one aspect, the low temperature bonding process occurs by a self-bonding process.

Alternatively, a self-bonding process occurs by activating one or both of the wafer surfaces to be bonded by plasma cleaning. In particular, plasma cleaning activates the wafer surface using a plasma derived from gases such as argon, ammonia, neon, water vapor, and oxygen. It is believed that the plasma cleaning step activates the surface of the wafer by creating dangling silicon bonds. The activated target wafer surface 2203 is placed against a face of the donor wafer surface 2103, which will create a layer-to-layer interface. The wafers are in a sandwiched structure having exposed wafer faces, and the target wafer still has a desired concentration of particles 2111 intact. A selected amount of pressure is placed on each exposed face of the wafers to self-bond one wafer to the other.

Figure 9:
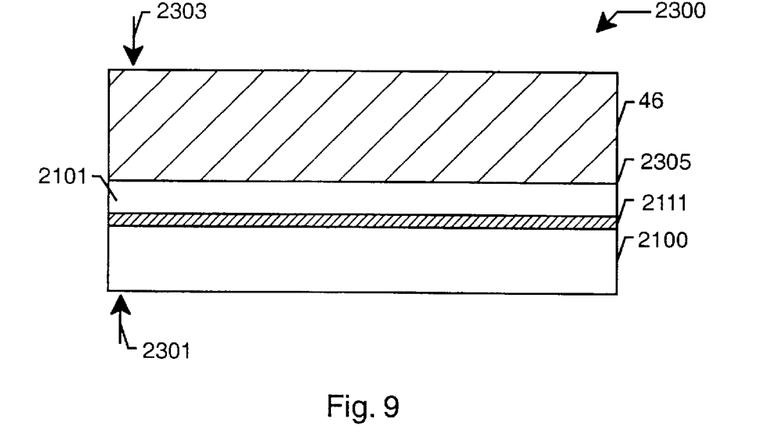

After beta bonding the wafers into a substrate assembly 2300, as shown in FIG. 9, the target wafer 46 and the donor wafer 2100 are joined at a layer-to-layer interface 2305. The particles or microbubbles still form a separation region 2111 in the donor wafer. After beta bonding, the substrate assembly 2300 is processed to separate the thin film 2101 from the donor wafer 2100.

Figure 10:
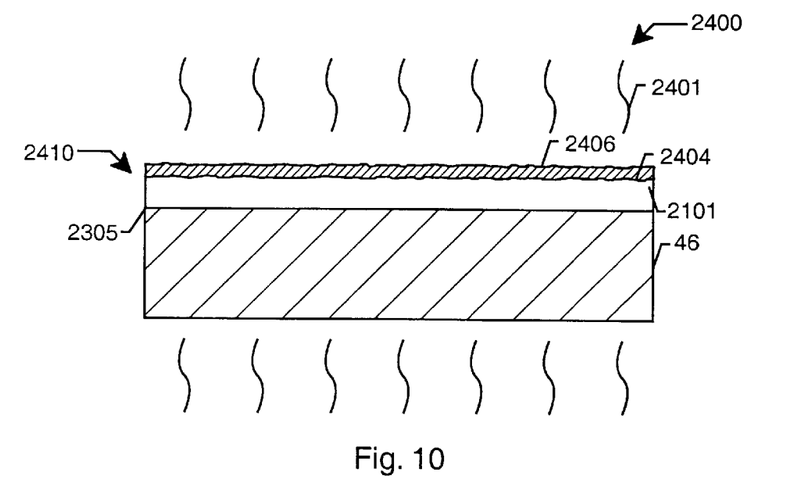

FIG. 10 shows a final bonding, or annealing, step occurs between the target wafer and thin film of material to form a hybrid wafer 2410. These embodiments often require high temperatures (e.g., above 700° C.). The final bonding step creates a strong bond between the thin film and the target substrate. It is believed that covalent bonds form between the two layers of silicon when the assembly is subjected to a sufficiently high temperature for a sufficient period of time, for example at 1,000° C. for approximately 1 hour. Lower temperatures generally require longer periods of time for the same degree of bonding to take place. During the annealing process, a thin film of thermal oxide 2406 may grow on the thin film 2101. The final bonding process provides an electrical contact between the thin film and the target wafer, as well as a robust mechanical bond that can withstand subsequent wafer processing.

Alternatively, the two silicon surfaces can be bonded by applying voltage between the two layers to establish a current flow through the hybrid wafer. The electric current heats the wafers to induce a bonding between the wafers. This technique limits the amount of crystal defects introduced into the silicon wafers during the bonding process, since substantially no mechanical force is needed to initiate the bonding action between the wafers. Damage may also be limited because the localized heating at the layer—layer interface is greater, due to increased series resistance in this region, than in the bulk of either the target substrate or the thin film.

After bonding the wafers, silicon-on-silicon has a target substrate with an overlying film of silicon material, as also illustrated in FIG. 10. The detached surface of the film of silicon material 2404 is often rough and may need finishing for some applications. Finishing occurs using a combination of grinding and/or polishing techniques. In some embodiments, such as when the thin film has been separated using a blister-separation method, the detached surface may undergo a step of grinding, or lapping, before the polishing step.

Figure 11:
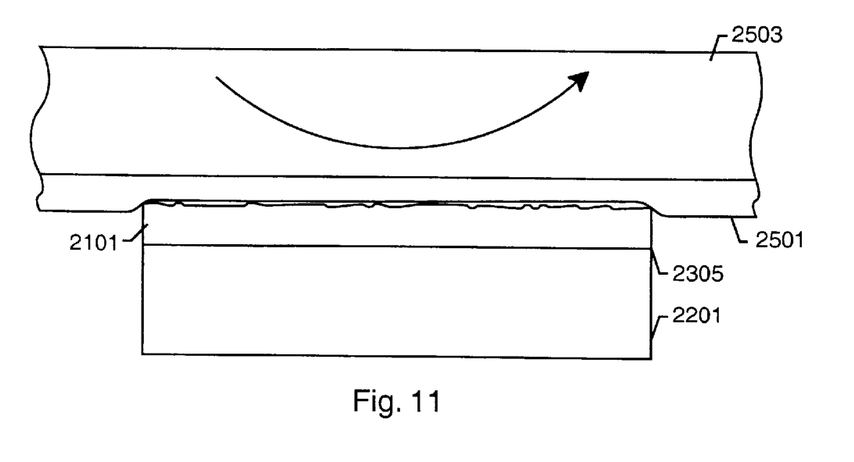

If the thin film was separated using a controlled cleavage process, the relative smooth and fracture-free surface allows chemical mechanical polishing or planarization ("CMP") techniques without a prior lapping step, as illustrated by FIG. 11. In CMP, a slurry mixture is applied directly to a polishing surface 2501 which is attached to a rotating platen 2503. This slurry mixture can be transferred to the polishing surface by way of an orifice, which is coupled to a slurry source. The slurry is often a solution containing a mild abrasive and an oxidizer, e.g., $H_2O_2$, $KIO_3$, or ferric nitrate. The abrasive is often very fine borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A hybrid silicon wafer comprising:

a thin film of single-crystal silicon material bonded to and electrically coupled to a silicon target wafer;

the thin film having an exposed cleaved surface.

2. The hybrid silicon wafer of claim 1 wherein the silicon target wafer is a single-crystal silicon wafer.

3. The hybrid silicon wafer of claim 1 wherein the thin film is less than about 15 microns thick.

4. The hybrid silicon wafer of claim 3 wherein the thin film has been separated from a donor wafer.

5. The hybrid silicon wafer of claim 1 wherein the thin film is beta bonded to the target wafer.

6. The hybrid silicon wafer of claim 1 wherein the thin film is securely bonded to the target wafer.

7. The hybrid silicon wafer of claim 1 further comprising electronic circuit devices disposed at least partially within the thin film.

8. The hybrid silicon wafer of claim 3 wherein the bonding process bonds the target wafer to the donor wafer at a temperature less than about 400° C.

9. A hybrid silicon wafer comprising:

a single-crystal silicon donor wafer with an implanted layer of particles at a selected depth from a substrate-to-substrate interface;

a silicon target wafer bonded to the donor wafer at the substrate-to-substrate interface by a bonding process, the donor wafer being in electrical contact with the target wafer;

the implanted layer being less than about 15 microns from the substrate-to-substrate interface.

10. The hybrid silicon wafer of claim 9 wherein the implanted layer of particles comprises hydrogen ions.

11. A hybrid silicon wafer comprising:

a single-crystal silicon donor wafer with a layer of microbubbles at a selected depth from a substrate-to-substrate interface;

a silicon target wafer bonded to the donor wafer at the substrate-to-substrate interface, the donor wafer being in electrical contact with the target wafer;

the layer of microbubbles being less than about 15 microns from the substrate-to-substrate interface.

* * * * *